(12) United States Patent
Chen (10) Patent No.: US 10,717,881 B2
(45) Date of Patent: Jul. 21, 2020

(54) ELECTRICAL DEVICE CAPABLE OF WATER-RESISTING, VAPOR RESISTANT AND ELECTRICALLY CONDUCTING IN MOISTURE-CONTAINING ENVIRONMENT AND METHOD FOR MAKING THE SAME

(71) Applicant: Dazzeon Technology Co., Ltd., Taipei (TW)

(72) Inventor: Thomas Chen, Taipei (TW)

(73) Assignee: Dazzeon Technology Co., LTD, Taipei (TW)

( * ) Notice: Subject to any disclaimer, the term of this patent is extended or adjusted under 35 U.S.C. 154(b) by 59 days.

(21) Appl. No.: 15/776,553

(22) PCT Filed: Nov. 30, 2016

(86) PCT No.: PCT/CN2016/107980
§ 371 (c)(1),
(2) Date: May 16, 2018

(87) PCT Pub. No.: WO2017/092674
PCT Pub. Date: Jun. 8, 2017

(65) Prior Publication Data
US 2018/0334573 A1 Nov. 22, 2018

(51) Int. Cl.
*H01B 1/00* (2006.01)
*C09D 5/08* (2006.01)
(Continued)

(52) U.S. Cl.
CPC ............... *C09D 5/08* (2013.01); *C08L 83/04* (2013.01); *C09D 1/00* (2013.01); *C09D 7/40* (2018.01);
(Continued)

(58) Field of Classification Search
CPC ......... C08L 83/04; C09D 183/04; C09D 1/00; C09D 5/08; C09D 7/40; C09D 7/65; C09D 7/67; C14C 9/00; H05K 5/0217
See application file for complete search history.

(56) References Cited

U.S. PATENT DOCUMENTS 7,037,729 B2 * 5/2006 Nie .................... B01J 19/0046
422/50
8,188,035 B2 5/2012 Hsieh
(Continued)

FOREIGN PATENT DOCUMENTS

| CN | 101838496 A | 9/2010 |
| CN | 101722656 B | 8/2012 |

(Continued)

OTHER PUBLICATIONS

Kitai, A., Luminescent Materials and Applications, p. 24, John Wiley and Sons, Ltd. (2008) (Year: 2008).*
(Continued)

*Primary Examiner* — Mark Kopec
*Assistant Examiner* — Jaison P Thomas
(74) *Attorney, Agent, or Firm* — Haverstock & Owens LLP (57) ABSTRACT

An electrical device capable of water-resisting, vapor resistant and electrically conducting in a moisture-containing environment and a method for making such electrical device are provided. The present invention for use in electrically conductive aqueous solutions enables the electrical device to be electrically conductive in any direction because of quantum tunneling effect. The electrical device includes a device body having at least one surface, and a plurality of nanoparticles embedded in one of surface pores of the at least one surface of the device body. The particle size of the nanoparticles is less than tens of nanometers.

1 Claim, 7 Drawing Sheets

(51) Int. Cl.
*C09D 7/40* (2018.01)
*C14C 9/00* (2006.01)
*C09D 7/65* (2018.01)
*C08L 83/04* (2006.01)
*C09D 183/04* (2006.01)
*C09D 1/00* (2006.01)
*H05K 5/02* (2006.01)

(52) U.S. Cl.
CPC .................. *C09D 7/65* (2018.01); *C09D 7/67* (2018.01); *C09D 183/04* (2013.01); *C14C 9/00* (2013.01); *H01B 1/00* (2013.01); *H05K 5/0217* (2013.01)

(56) References Cited

U.S. PATENT DOCUMENTS 8,378,877 B2 * 2/2013 Tishin .................... C04B 38/02
342/1

2005/0032244 A1 * 2/2005 Nie ...................... B01J 19/0046
506/12
2008/0274344 A1 * 11/2008 Vieth ...................... B01J 23/42
428/304.4
2012/0045850 A1 * 2/2012 Aimiya .................. B82Y 15/00
436/501
2013/0251948 A1 * 9/2013 Lyons ...................... B32B 5/16
428/148

FOREIGN PATENT DOCUMENTS

| | | |
|---|---|---|
| CN | 103442510 A | 12/2013 |
| CN | 103825980 A | 5/2014 |
| TW | 200604605 | 2/2006 |

OTHER PUBLICATIONS

Attached please find the International Search Report and Written Opinion from International Application No. PCT/CN2016/107980.

* cited by examiner

ELECTRICAL DEVICE CAPABLE OF WATER-RESISTING, VAPOR RESISTANT AND ELECTRICALLY CONDUCTING IN MOISTURE-CONTAINING ENVIRONMENT AND METHOD FOR MAKING THE SAME

BACKGROUND OF THE INVENTION

Field of the Invention

The present invention relates to an electrical device with water-resistance, and more particularly, to an electrical device capable of water-resisting, vapor resistant and electrically conducting in a moisture-containing environment. Also the present invention relates to the method for making such electrical device.

Background

Traditional coating methods, such as chemical deposition or physical deposition, are applied for coating an article with different materials, such as conductors, nonconductors and polymers, so as to provide the article with properties as desired. For an instance, when the surface of an electrical device is coated with a layer of hydrophobic nonconductor, the electrical device will be electrically conductive yet waterproof in an electrically conductive aqueous solution. However, the coating formed by such method normally has a thickness ranging from tens of nanometers to several micrometers which enables the electrical device to be electrically conductive only in the Z-axis direction.

Figure 1:
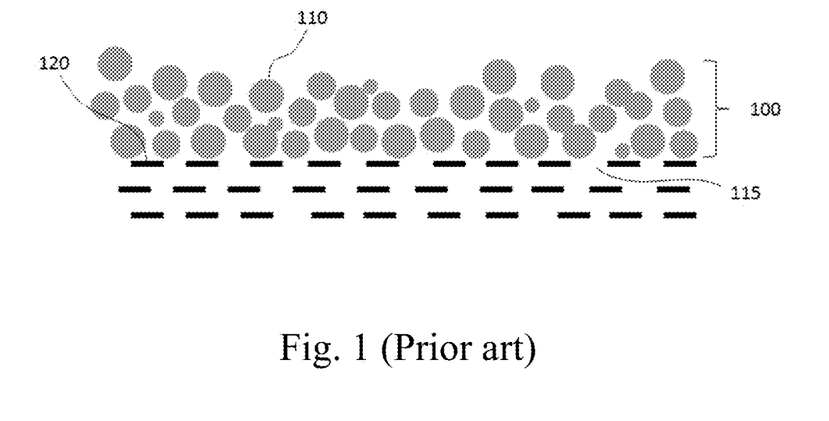
FIG. 1 schematically shows the coating formed on the surface of an electrical device according to the prior art.

Although the conventional chemical or physical coating method enables the electrical device to be waterproof and electrically conductive in the Z-axis direction in an electrically conductive aqueous solution, the coatings formed by the above coating methods are limited by the material properties of thin coatings, such as nonresistance to rinsing with an alkaline solution or mechanical friction. This is because the particles 110 contained in the coating 100 cannot penetrate the surface pores 115 of the electrical device, but merely accumulate onto the surface 120 due to the relatively large particle size as shown in FIG. 1.

SUMMARY OF THE INVENTION

Quantum tunneling effect refers to the quantum mechanical phenomenon where a particle tunnels through a barrier that classically could not be penetrated. This is because, according to quantum mechanics, microscopic particles have the property of waves, and thus there is a chance passing through the potential barrier.

In view of the above problems of the prior art, the present invention provides an electrical device capable of water-resisting, vapor resistant and electrically conducting in a moisture-containing environment or an electrically conductive aqueous solution by utilizing the quantum tunneling effect. Thus, the waterproofing and vapor resistant technology of the present invention for use in a moisture-containing environment or an electrically conductive aqueous solution enables the electrical device to be electrically conductive in any direction rather than only in the Z-axis direction.

In addition, the present invention provides an effective manner in which the particles can be embedded in the surface pores of an electrical device, such that the electrical device can withstand the rinsing with an alkaline solution or mechanical friction and the material properties of the electrical device would be not affected thereby.

According to one aspect of the present invention, an electrical device capable of water-resisting, vapor resistant and electrically conducting in a moisture-containing environment is provided. The provided electrical device includes a device body having at least one surface; and a plurality of nano-particles embedded in one of surface pores of the at least one surface of the device body. According to the present invention, the particle size of the plurality of nano-particles is less than tens of nanometers.

Preferably, the nano-particles have an average diameter of less than 20 nanometers.

Preferably, the nano-particles have an average diameter of less than 10 nanometers.

Preferably, the nano-particles are made of at least one selected from a group consisting of silica, siloxane, cadmium selenide (CdSe), titanium dioxide ($TiO_2$) and gallium arsenide (GaAs).

Preferably, the nano-particles are silica particles having an average diameter of less than 11 nm.

Preferably, the nano-particles are siloxane particles having an average diameter of less than 5 nm.

Preferably, the nano-particles are CdSe particles having an average diameter of less than 4 nm.

Preferably, the nano-particles are $TiO_2$ particles having an average diameter of less than 7 nm.

Preferably, the nano-particles are GaAs particles having an average diameter of less than 10 nm.

According to another aspect of the present invention, a method for making an electrical device capable of water-resisting, vapor resistant and electrically conducting in a moisture-containing environment is provided. By means of the provided method, the electrical device would be provided with water and vapor resistant properties, i.e. shielded from water or vapor, while the electrical conductivity thereof would be maintained. According to the present invention, the provided method includes the steps of heating the device body to a first temperature for a first duration; applying a liquid medium onto the at least one surface of the device body; and heating the device body to a second temperature for a second duration. According to the present invention, the liquid medium is a solvent and contains the plurality of nano-particles dispersed therein. According to the present invention, the first temperature and the second temperature are respectively ranged from 30☐ to 300☐, and the first duration and the second duration are shorter than 10 hours.

Preferably, the liquid medium is applied onto the at least one surface of the device body by one of spraying, smearing, immersing, or any other forms of contact of the device and the combination thereof.

Preferably, the solvent is selected from a group consisting of water, hydrocarbon, octane, toluene, chloroform, ethanol, and a combination thereof.

Preferably, the method further includes repeating the heating and the applying for predetermined times.

Preferably, the nano-particles have an average diameter of less than 20 nanometers.

Preferably, the nano-particles have an average diameter of less than 10 nanometers.

Preferably, the nano-particles are made of at least one selected from a group consisting of silica, siloxane, cadmium selenide (CdSe), titanium dioxide ($TiO_2$) and gallium arsenide (GaAs).

Preferably, the nano-particles are silica particles having an average diameter of less than 11 nm.

Preferably, the nano-particles are siloxane particles having an average diameter of less than 5 nm.

Preferably, the nano-particles are CdSe particles having an average diameter of less than 4 nm.

Preferably, the nano-particles are TiO$_2$ particles having an average diameter of less than 7 nm.

Preferably, the nano-particles are GaAs particles having an average diameter of less than 10 nm.

The aforementioned aspects and other aspects of the present invention will be better understood by reference to the following exemplary embodiments and drawings.

BRIEF DESCRIPTION OF THE DRAWINGS

FIGS. 4a to 4c show the size distribution of the particles contained in the liquid medium applied to the surface of the electrical device made by the method in accordance with an embodiment of the present invention, wherein

FIG. 5b shows the result of the energy dispersive X-ray spectroscopy (EDX) measurement at the position indicated by "Spectrum 1" as shown in FIG. 5a.

FIG. 6b shows the result of the energy dispersive X-ray spectroscopy (EDX) measurement at the position indicated by "Spectrum 3" as shown in FIG. 6a.

FIG. 7b shows the result of the energy dispersive X-ray spectroscopy (EDX) measurement at the position indicated by "Spectrum 4" as shown in FIG. 7a.

DETAILED DESCRIPTION OF THE PREFERRED EMBODIMENTS

While this invention will be fully described with preferred embodiments by reference to the accompanying drawings, it is to be understood beforehand that those skilled in the art can make modifications to the invention described herein and attain the same effect, and that the description below is a general representation to those skilled in the art and is not intended to limit the scope of the present invention. It will be understood that the appended drawings are merely schematic representations and may not be illustrated according to actual scale and precise arrangement of the implemented invention. Therefore, the scope of protection of the present invention shall not be construed based on the scale and arrangement as illustrated on the appended drawings and shall not be limited thereto.

Figure 2:
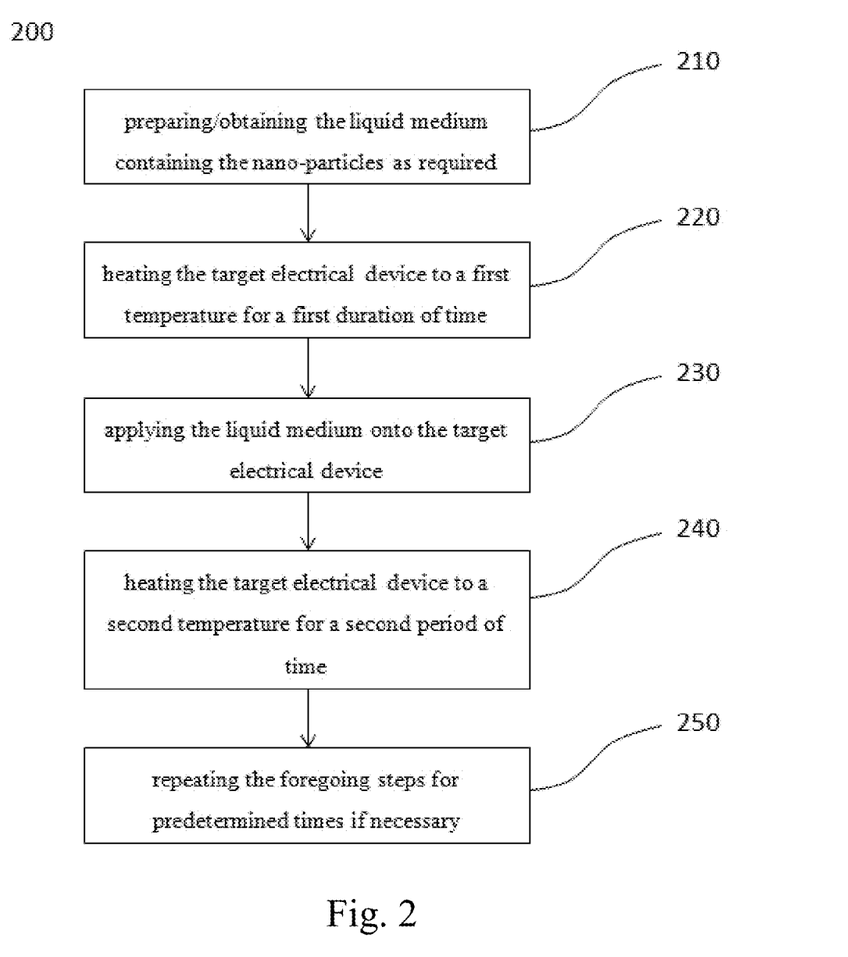
FIG. 2 is a flowchart illustrating the steps of the method for making an electrical device in accordance with an embodiment of the present invention.

FIG. 2 is a flowchart illustrating the steps of the method 200 for making an electrical device in accordance with an embodiment of the present invention. The method 200 begins at block 210, "preparing/obtaining the liquid medium containing the nano-particles as required." Typically, different nano-particles are required for different applications, and in order for these nano-particles to be well-dispersed without aggregation, different solvents for building such liquid medium are also required.

In one embodiment, the liquid medium includes water and octane as the solvent and contains a plurality of silica nano-particles having an average diameter of less than 11 nanometers dispersed therein. In the other embodiment, the liquid medium includes hydrocarbon or chloroform as the solvent and contains a plurality of siloxane nano-particles having an average diameter of less than 5 nanometers dispersed therein. In a further embodiment, the liquid medium includes toluene as the solvent and contains a plurality of cadmium selenide (CdSe) nano-particles having an average diameter of less than 4 nanometers dispersed therein. In still another embodiment, the liquid medium includes ethanol as the solvent and contains a plurality of titanium oxide (TiO$_2$) nano-particles having an average diameter of less than 7 nanometers dispersed therein. In still a further embodiment, the liquid medium includes hydrocarbon as the solvent and contains a plurality of gallium arsenide (GaAs) nano-particles having an average diameter of less than 10 nanometers dispersed therein.

Block 210 may be followed by block 220, "heating the target electrical device to a first temperature for a first duration of time." The first duration of time and the first temperature may vary depending on different electrical devices and different liquid medium, i.e. different nano-particles. According to the invention, the electrical device may be heated at a temperature ranging from 30□ to 300□ for a period of time less than 10 hours.

Block 220 may be followed by block 230, "applying the liquid medium onto the target electrical device." According to the present invention, the liquid medium is applied onto the surface of the target electrical device by means of, for example but not limited to, spraying, smearing or immersing and the combination thereof. Also, the length of time required for this step varies depending on different application, i.e. different electrical devices, and different liquid medium. For an instance, the electrical device may be immersed with the liquid medium for a period of time ranging from 1 second to 10 hours. If the liquid medium is applied to the electrical device via spraying or smearing, the amount of liquid medium to be applied will depend on the surface area of the electrical device.

Block 230 may be followed by block 240, "heating the target electrical device to a second temperature for a second period of time." The second period of time and the second temperature required for this step vary depending on different electrical devices and different liquid mediums. According to the present invention, the electrical device may be heated at a temperature ranging from 30□ to 300□ for a period of time less than 10 hours.

Optionally, the mentioned steps may be repeated, as shown in block 250, "repeating the foregoing steps for predetermined times if necessary." These steps may be repeated depending on different electrical devices and liquid medium used.

Figure 3:
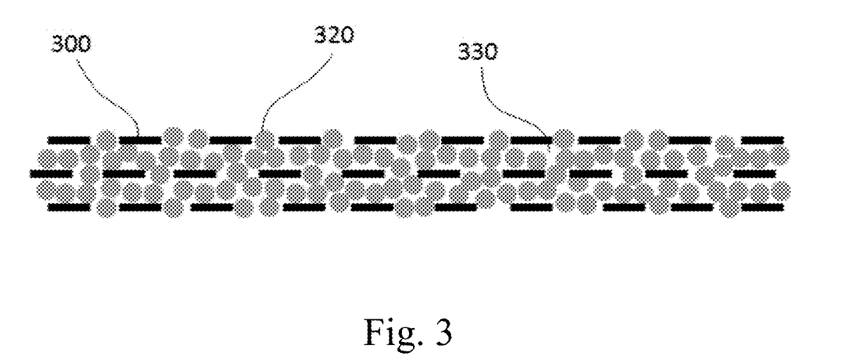
FIG. 3 schematically shows the surface of the electrical device made by the method in accordance with an embodiment of the present invention.

FIG. 3 schematically shows one portion of the device body 300 of the electrical device made by the method in accordance with an embodiment of the present invention. According to the present invention, since the nano-particles in the liquid medium are sufficiently small in relative to the surface pores of the device body of the electrical device, these nano-particles would be driven into the surface pores and individually embedded therein without aggregation under an increased temperature. As shown in FIG. 3 for illustration, through the method of the invention, after being heated for a predetermined time period, the nano-particles 320 will be embedded in the surface pores 330 of the portion of device body 300 of the electrical device. As these nano-particles 320 are embedded in the surface pores 330 of the device body 300 of the electrical device, the electrical device becomes hydrophobic and vapor resistant. Meanwhile, as these nano-particles 320 possessing aforementioned particle sizes are distributed over the surface of the electrical device by being embedded in the surface pores, instead of forming a coating of nano-particles on the surface with a certain thickness, e.g. a thickness ranging from tens of nanometers to several micrometers, the electrons are able to tunnel through because of the quantum tunneling effect, which enables the electrical device to be electrically conductive in any direction. Accordingly, the conductivity of the electrical device in an electrically conductive aqueous solution or a moisture containing environment could be maintained even the nano-particles are made of non-conductive materials. Moreover, the nano-particles 320 embedded in the surface pores 330 of the electrical device enables the electrical device to withstand the mechanical friction, and the material properties of the electrical device will be not affected thereby.

The following examples are provided to illustrate certain aspects of the present invention and to aid those skilled in the art in practicing this invention. These examples are provided for exemplary purpose, and are not intended to limit the scope of the invention in any manner.

In the following examples, DAZZEON Liquid® nano-particle solution, commercially available from DAZZEON Technology Co., Ltd., was used as the liquid medium according to the present invention.

Figure 4A:
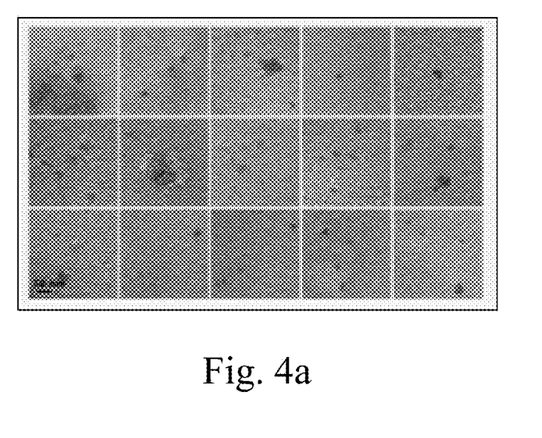
FIG. 4a is a transmission electron microscopy (TEM) photograph of the particles.
Figure 4B:
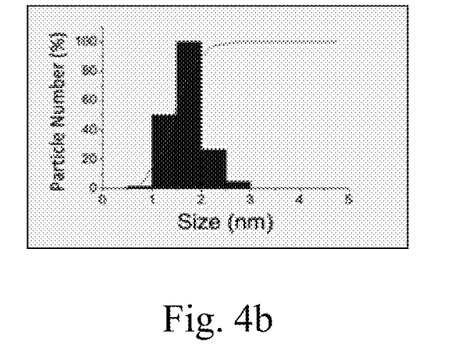
FIG. 4b illustrates the particle size distribution measured by TEM.
Figure 4C:
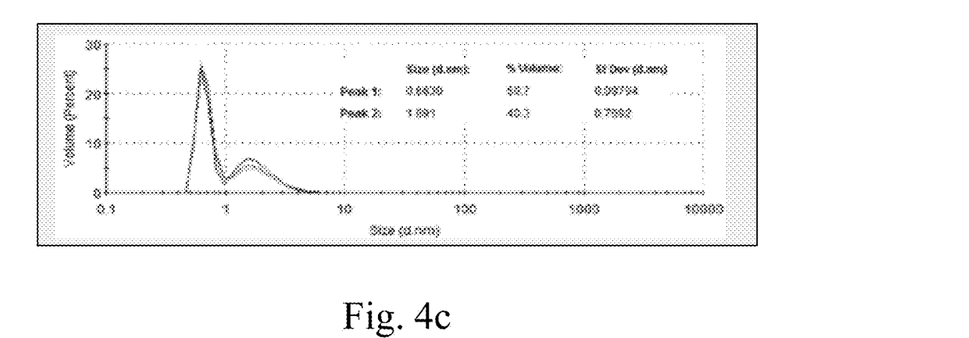
FIG. 4c illustrates the particle size distribution measured by a dynamic light scattering (DLS) manner.

FIGS. 4a to 4c show the particle size distribution of DAZZEON Liquid®, which was to be applied to the surface of the electrical device. FIG. 4a is a transmission electron microscopy (TEM) photograph showing the particles of DAZZEON Liquid®, while FIG. 4b illustrates the particle size distribution measured by TEM, and FIG. 4c illustrates the particle size distribution measured by a dynamic light scattering (DLS) manner. FIGS. 4b and 4c show that average particle diameter of the nano-particles is 1.7 nm when measured by TEM, and is 0.66 nm-1.89 nm when measured by DLS.

Example 1

In this example, took a bulb for an instance of the electrical device of the present invention. The method according to the present invention was applied to shield the bulb, the socket thereof and the copper wire connected to the socket, i.e. to provide the bulb with the ability in water-resisting, vapor resistant and electrically conducting in an aqueous solution or moisture-containing environment.

The details for shielding a 25 watt bulb, the socket thereof and the copper wire connected to the socket by the method of the present invention are illustrated as below. First, the required liquid medium, e.g. DAZZEON Liquid®, was prepared, containing 20 percent (in weight) of siloxane nano-particles and 80 percent (in weight) of hydrocarbon solvent. Second, the bulb, the socket and the copper wire were heated at 84□ for 6 minutes. Third, the bulb, the socket and the copper wire were immersed in DAZZEON Liquid® for 1.5 minutes, and then removed therefrom. Then, the bulb, the socket and the copper wire were heated again, at 82□ for 27 minutes. After these steps, the bulb, the socket and the copper wire were shielded since the siloxane nano-particles contained in DAZZEON Liquid® were embedded in the surface pores of the bulb, the socket and the copper wire, such that the bulb, the socket and the copper wire exhibited water and vapor resistant properties while maintaining electrical conductivity.

The water and vapor resistant properties and the electrical conductivity showed that the bulb was shielded and thus exhibited excellent water resistance. The electrical devices made by the method according to the present invention, i.e. the shielded bulb, the shielded socket and the shielded copper wire connected to the shielded socket, were fully immersed in a water tank containing water. During the testing, it could be found that the shielded bulb was illuminated normally without encountering a short circuit in the water. Apparently, by the method of the present invention, the shielded bulb, the shielded socket and the shielded copper wire all had excellent water and vapor resistant properties while maintaining electrical conductivity.

Example 2

In this example, took a Bluetooth earphone with a micro USB connector for an instance of the electrical device of the present invention. The method according to the present invention was applied to shield the micro USB connector, i.e. to provide the micro USB connector with the ability in water-resisting, vapor resistant and electrically conducting in an aqueous solution or moisture-containing environment.

The details for shielding a micro USB connector by applying the method of the present invention are illustrated as below. First, the required liquid medium, e.g. DAZZEON Liquid®, was prepared, containing 20 percent (in weight) of siloxane nano-particles and 80 percent (in weight) of hydrocarbon solvent. Second, the micro USB connector of the earphone was heated at 89□ for 9 minutes. Third, the micro USB connector of the earphone was immersed in DAZZEON Liquid®, and then heated at 92□ for 28 minutes. After these steps, the micro USB connector of the earphone was shielded since the siloxane nano-particles contained in DAZZEON Liquid® were embedded in the surface pores of the connector, such that the micro USB connector of the earphone exhibited water and vapor resistant properties while maintaining electrical conductivity.

For testing the water and vapor resistant properties, electrical conductivity and the ability to endure mechanical friction, the micro USB connector of the earphone was immersed in water after having been plugged and unplugged for 5000 times. The plug and unplug testing results were illustrated in Table 1 as below.

TABLE 1

Plug and unplug test for the micro USB connector of an earphone

|  | Charging Function | Bluetooth | MIC | Music Play |
| --- | --- | --- | --- | --- |
| Before Test | OK | OK | OK | OK |
| After 5000 times plug & unplug tests | OK | OK | OK | OK |

It was clear from Table 1 that, all functions of the earphone, including the charging function, Bluetooth function, music play function, and MIC function, were completely unaffected by the plug and unplug operation of the micro USB connector. Even after the micro USB connector had been plugged and unplugged for over 5000 times, the charging function, Bluetooth function, music play function, and MIC function of the earphone still worked normally. Apparently, by the method of the present invention, the shielded micro USB connector of the earphone exhibited excellent water and vapor resistant properties while maintaining electrical conductivity, and possessed good mechanical friction endurance.

Example 3

In this example, took the printed circuit board (PCB) for an instance of the electrical device of the present invention. The method according to the present invention was applied to shield the PCB, i.e. to provide the PCB with the ability in water-resisting, vapor resistant and electrically conducting in an aqueous solution or moisture-containing environment.

The details for shielding a printed circuit board (PCB) by applying the method according to the present invention are illustrated as below. First, the required liquid medium, e.g. DAZZEON Liquid®, was prepared, containing 20 percent (in weight) of siloxane nano-particles and 80 percent (in weight) of hydrocarbon solvent. Second, the PCB was heated at 118☐ for 7 minutes, and then immersed with the liquid medium, DAZZEON Liquid®, for 2 minutes. Afterward, the PCB was heated at 129☐ for 36 minutes. After these steps, the PCB was shielded since the siloxane nano-particles contained in DAZZEON Liquid® were embedded in the surface pores of the PCB, such that the PCB exhibited water and vapor resistant properties while maintaining electrical conductivity.

Table 2 illustrated the change in impedance after the PCB was shielded by applying the method in accordance with the invention.

TABLE 2

| Test Point | PCB1 | | PCB2 | |
| --- | --- | --- | --- | --- |
| | A | B | C | D |
| Before | 95.50 Ω | 98.03 Ω | 101.37 Ω | 100.01 Ω |
| After | 95.51 Ω | 96.48 Ω | 100.86 Ω | 100.03 Ω |
| Difference | 0.01 Ω | −1.55 Ω | −0.51 Ω | 0.02 Ω |
| | (0.01%) | (−1.56%) | (−0.50%) | (0.02%) |

The shielded PCB was tested. As shown in Table 2, in PCB1, the impedance of the unshielded PCB at point A was measured at 95.50Ω, and was measured at 95.51Ω after the PCB was shielded by applying the method of the present invention which showed only a 0.01Ω increase (0.01% increase). Similarly, in test point B, C and D, the impedance of the unshielded PCB were measured at 98.03Ω, 101.37Ω, and 100.01Ω, respectively, and were measured at 96.48Ω, 100.86Ω, and 100.03Ω after the PCB was shielded by the present invention. All of the tests showed a difference of less than 2% in the impedance of the PCB. Apparently, the electrical conductivity of the PCB remained almost unchanged after being shielded by applying the method of the present invention.

Figure 5A:
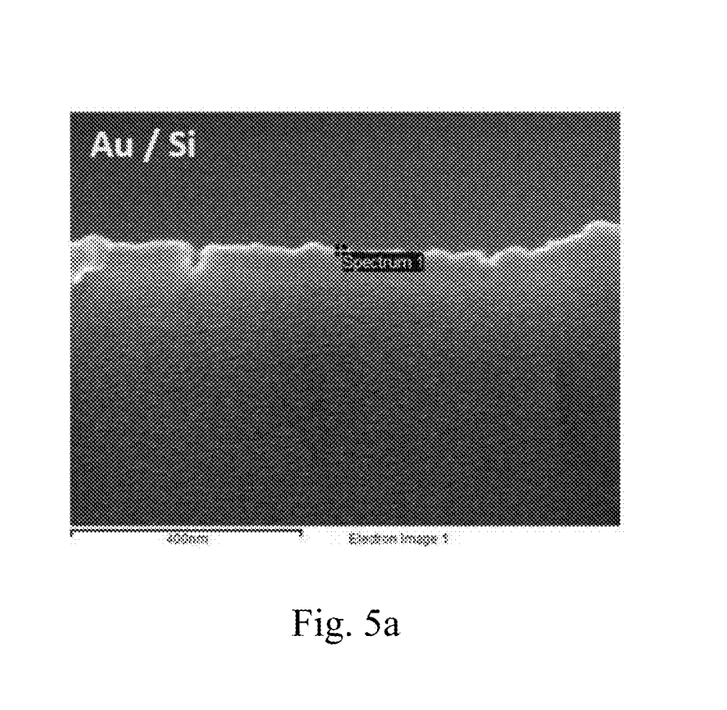
FIG. 5a is a scanning electron microscopy (SEM) photograph showing the cross section of the shielded PCB in accordance with one embodiment of the present invention.
Figure 5B:
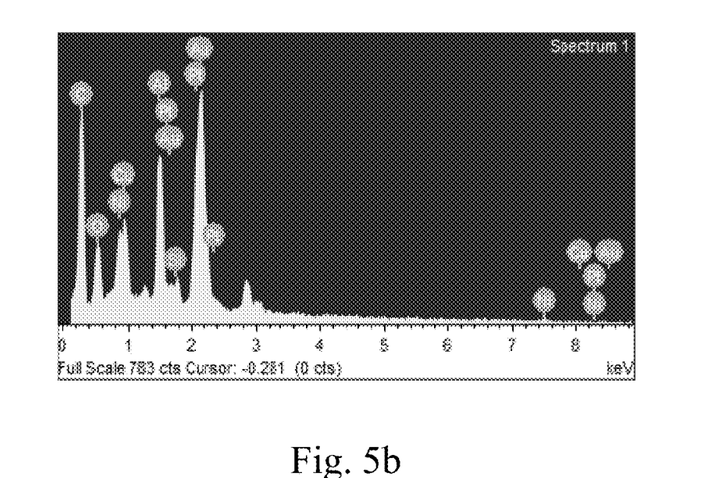
Figure 6A:
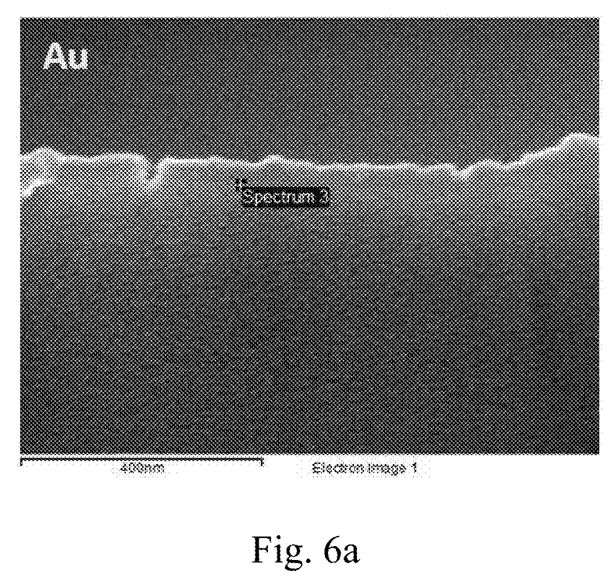
FIG. 6a is a SEM photograph showing the cross section of the shielded PCB in accordance with the embodiment of the present invention.
Figure 6B:
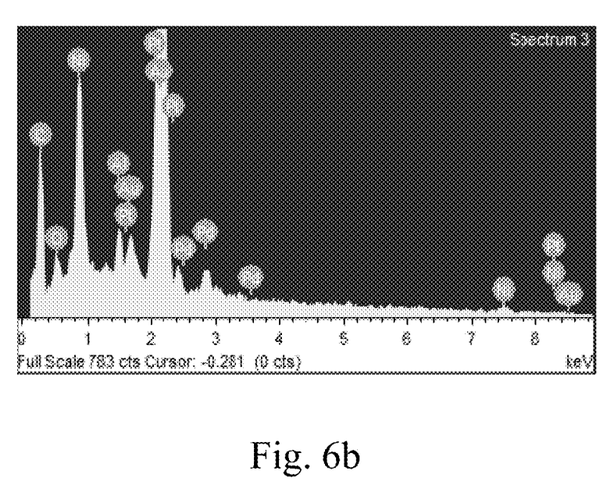
Figure 7A:
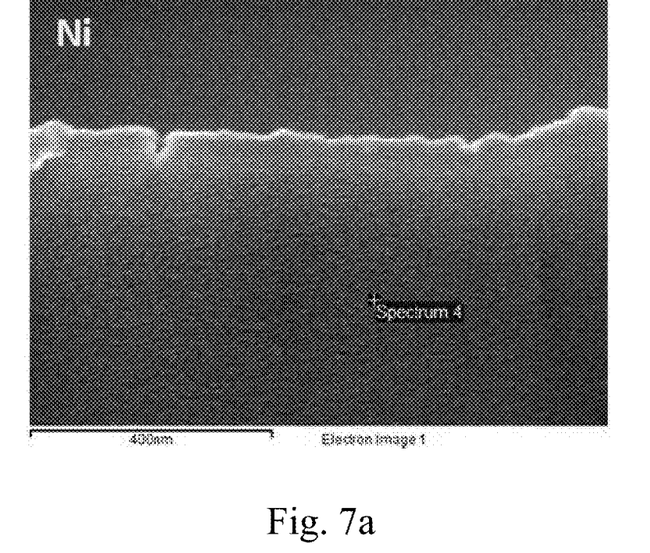
FIG. 7a is a SEM photograph showing the cross section of the shielded PCB in accordance with the embodiment of the present invention.
Figure 7B:
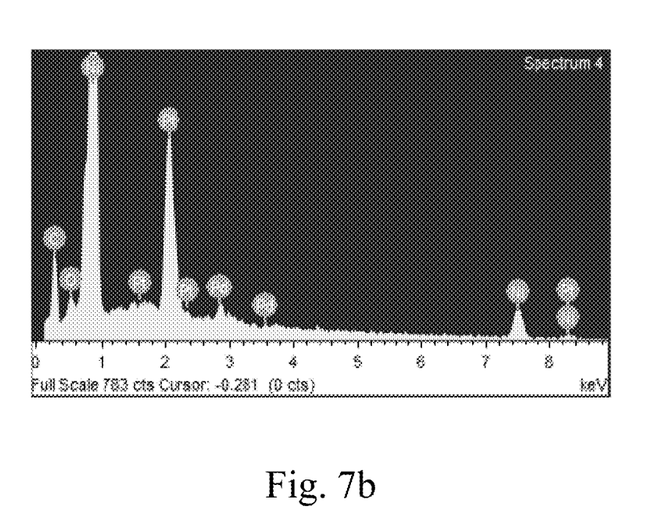

FIGS. 5a, 5b, 6a, 6b, 7a, and 7b further showed that the nano-particles contained in DAZZEON Liquid®, i.e. the silicon-based particles, were merely embedded in the surface of the PCB, wherein FIGS. 5a, 6a and 7a were scanning electron microscopy (SEM) photographs showing the same cross section of the shielded PCB in accordance with one embodiment of the present invention, and FIGS. 5b, 6b and 7b showed the results of the energy dispersive X-ray spectroscopy (EDX) measurement at the positions indicated by "Spectrum 1", "Spectrum 3" and "Spectrum 4" as shown in FIGS. 5a, 6a, and 7a, respectively. In more specific, "Spectrum 1", "Spectrum 3" and "Spectrum 4" indicated different locations and different depths from the surface of the PCB.

As shown in these figures, it was noted that at the position "Spectrum 1", which was at almost the surface of the PCB, the EDX analysis showed the existing of Si. In comparison, at the positions "Spectrum 3" and "Spectrum 4", no silicon was detected. That is, the silicon-based nano-particles contained in DAZZEON Liquid® were embedded merely in the surface of the PCB at some specific locations, but did not form a coating or a layer of a specific thickness on the surface of the PCB.

As these nano-particles are distributed over the surface of the electrical device by being embedded in the surface pores, instead of forming a coating of nano-particles on the surface with a certain thickness, the electrons are able to tunnel through because of the quantum tunneling effect, which enables the electrical device to be electrically conductive in any direction.

Such embedded nano-particles provide the electrical device, including but not limited to, the bulb, the micro USB connector, and the PCB with excellent water and vapor resistant properties while maintaining electrical conductivity, and possessed good mechanical friction endurance. Therefore, the electrical devices according to the present invention are advantageous in the ability of water-resisting, vapor resistant and electrically conducting in an electrically conductive aqueous solution or a moisture-containing environment.

It will be understood that the above description of embodiments is given by way of example only and that various modifications may be made by those with ordinary skill in the art. The above specification, examples, and data provide a complete description of the present invention and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

What is claimed is:

1. An electrical device capable of water-resisting, vapor resistant and electrically conducting in a moisture-containing environment, comprising:
   a device body having at least one surface; and
   a plurality of nano-particles embedded in one of surface pores of said at least one surface of said device body, said plurality of nano-particles are siloxane particles having a particle size less than 5 nanometers.

* * * * *